US012609433B2

(12) United States Patent
Ko et al.

(10) Patent No.: US 12,609,433 B2
(45) Date of Patent: Apr. 21, 2026

(54) ELECTRONIC DEVICE INCLUDING A SEMICONDUCTOR ELEMENT ON A GLASS SUBSTRATE, WHERE THE SEMICONDUCTOR ELEMENT IS CONNECTED TO A FEED LINE BY A SECOND PATTERN AND A VIA HOLE

(71) Applicants:SAMSUNG ELECTRONICS CO., LTD., Suwon-si (KR); POSTECH Research and Business Development Foundation, Pohang-si (KR)

(72) Inventors: Seungtae Ko, Suwon-si (KR); Youngju Lee, Suwon-si (KR); Jaehong Choi, Pohang-si (KR); Wonbin Hong, Pohang-si (KR)

(73) Assignees: SAMSUNG ELECTRONICS CO., LTD., Suwon-si (KR); POSTECH Research and Business Development Foundation, Pohang-si (KR)

( * ) Notice: Subject to any disclaimer, the term of this patent is extended or adjusted under 35 U.S.C. 154(b) by 87 days.

(21) Appl. No.: 18/415,219

(22) Filed: Jan. 17, 2024

(65) Prior Publication Data

US 2024/0154285 A1 May 9, 2024

Related U.S. Application Data

(63) Continuation of application No. PCT/KR2022/006278, filed on May 2, 2022.

(30) Foreign Application Priority Data

Aug. 6, 2021 (KR) ........................ 10-2021-0103843

(51) Int. Cl.
H01P 5/02 (2006.01)
H01P 1/18 (2006.01)
(Continued)

(52) U.S. Cl.
CPC .................. H01P 5/02 (2013.01); H01P 1/18 (2013.01); H01Q 1/3291 (2013.01); H01Q 3/46 (2013.01); H01Q 15/002 (2013.01); H10D 86/80 (2025.01)

(58) Field of Classification Search
CPC ............................... H01Q 1/3291; H01P 5/02
(Continued)

(56) References Cited

U.S. PATENT DOCUMENTS 7,190,325 B2    3/2007  Nagy
7,679,563 B2    3/2010  Werner et al.
(Continued)

FOREIGN PATENT DOCUMENTS

CN      209249695 U      8/2019
CN      112002989 A      11/2020
(Continued)

OTHER PUBLICATIONS

L. Zhang et al., "Electronically Radiation Pattern Steerable Antennas Using Active Frequency Selective Surfaces," IEEE Transactions on Antennas and Propagation, vol. 61, No. 12, pp. 6000-6007, Dec. 12, 2013.
(Continued)

*Primary Examiner* — Benny T Lee
(74) *Attorney, Agent, or Firm* — Sughrue Mion, PLLC

(57) ABSTRACT

An electronic device includes: a glass substrate including a first surface and a second surface opposite to the first surface; a semiconductor element provided on the first surface of the glass substrate; a first pattern provided on the first surface of the glass substrate, the first pattern being electrically connected to a first end of the semiconductor element; a second pattern provided on the first surface of the glass substrate, the second pattern being electrically connected to a second end of the semiconductor element; a
(Continued)

feeding line provided on the second surface of the glass substrate; and a via hole which passes through the glass substrate in a first direction, the via hole electrically connecting the feeding line to the second pattern.

20 Claims, 9 Drawing Sheets

(51) Int. Cl.

| | | |
|---|---|---|
| *H01Q 1/32* | (2006.01) | |
| *H01Q 3/46* | (2006.01) | |
| *H01Q 15/00* | (2006.01) | |
| *H10D 86/80* | (2025.01) | |

(58) Field of Classification Search
USPC .......................................... 343/713; 333/247
See application file for complete search history.

(56) References Cited

U.S. PATENT DOCUMENTS

| | | | |
|---|---|---|---|
| 8,339,320 | B2 | 12/2012 | Sievenpiper |
| 9,030,373 | B2 | 5/2015 | Sim |
| 9,793,973 | B2 | 10/2017 | Kim et al. |
| 10,756,416 | B2 | 8/2020 | Hwangbo et al. |
| 10,797,108 | B2 | 10/2020 | Hettak et al. |
| 10,911,168 | B2 | 2/2021 | Studer et al. |
| 12,107,340 | B2 | 10/2024 | Chen et al. |
| 2014/0104157 | A1 | 4/2014 | Burns et al. |
| 2017/0294720 | A1 | 10/2017 | Murakowski et al. |
| 2020/0169291 | A1 | 5/2020 | Cho et al. |

FOREIGN PATENT DOCUMENTS

| | | | |
|---|---|---|---|
| CN | 112038777 | A | 12/2020 |
| JP | 8-120689 | A | 5/1996 |
| JP | 3033369 | B2 | 4/2000 |
| JP | 2012-249205 | A | 12/2012 |
| JP | 2019-80298 | A | 5/2019 |
| JP | 2020-195002 | A | 12/2020 |
| JP | 6840403 | B2 | 3/2021 |
| KR | 10-2016-0031860 | A | 3/2016 |
| KR | 10-2017-0031527 | A | 3/2017 |
| KR | 10-2020-0046704 | A | 5/2020 |
| KR | 10-2020-0062481 | A | 6/2020 |
| KR | 10-2021-0004805 | A | 1/2021 |
| WO | 2020/189453 | A1 | 9/2020 |

OTHER PUBLICATIONS

T. Jiang et al., "Low-DC Voltage-Controlled Steering-Antenna Radome Utilizing Tunable Active Metamaterial," IEEE Transactions on Microwave Theory and Techniques, vol. 60, No. 1, pp. 170-178, Jan. 1, 2012.
Communication issued Oct. 9, 2024 by the European Patent Office in European Patent Application No. 22853230.5.

W. Roh et al., "Millimeter-wave beamforming as an enabling technology for 5G cellular communications: theoretical feasibility and prototype results," in IEEE Communications Magazine, vol. 52, No. 2, pp. 106-113, Feb. 2014, doi: 10.1109/MCOM.2014.6736750.
Fulya Bagci et al., "A glass based dual band frequency selective surface for protecting systems against WLAN signals", AEU—International Journal of Electronics and Communications, vol. 82, Dec. 2017, pp. 426-434, ISSN 1434 8411, https://doi.org/10.1016/j.aeue.2017.10.018.
S. Habib, G. I. Kiani and M. F. U. Butt, "Mobile Phone Signals Interference Cancellation With Improved WLAN Transmission and Thermal Insulation of Buildings Using FSS and RC Film," in IEEE Microwave and Wireless Components Letters, vol. 30, No. 9, pp. 923-926, Sep. 2020, doi: 10.1109/LMWC.2020.3015697.
Fang Ma and Long Li, "Design of a Tri-bandpass FSS on dual-layer energy saving glass for improving RF transmission in green buildings," Oct. 16, 2015 IEEE International Conference on Communication Problem-Solving (ICCP), Guilin, 2015, pp. 405-407, doi: 10.1109/ICCPS.2015.7454187.
Q. Xi, C. Ma, H. Li, B. Zhang, C. Li and L. Ran, "A Reconfigurable Planar Fresnel Lens for Millimeter-Wave 5G Frontends," in IEEE Transactions on Microwave Theory and Techniques, vol. 68, No. 11, pp. 4579-4588, Nov. 2020, doi: 10.1109/TMTT.2020.3025337.
H. Li et al., "Reconfigurable Fresnel Lens Based on an Active Second-Order Bandpass Frequency-Selective Surface," in IEEE Transactions on Antennas and Propagation, vol. 68, No. 5, pp. 4054-4059, May 2020, doi: 10.1109/TAP.2019.2948392.
S. Cho and H. -J. Song, "Ultra-low Power Beamforming Wideband OFDM Signal with Active GRIN Lens at 19 GHz," 2020 IEEE International Symposium on Antennas and Propagation and North American Radio Science Meeting, Montreal, QC, Canada, Jul. 5, 2020, pp. 583-584, doi: 10.1109/IEEECONF35879.2020.9329701.
"5G", Altair, 13 pages, Retrieved on Jan. 17, 2024, https://www.altair.com/5g/.
"Tarana Wireless Brings Non-Line-of-Sight Innovation to Wireless Transport", RCR Wireless News, Jan. 19, 2017, 2 pages, https://www.rcrwireless.com/20170119/network-infrastructure/tarana-wireless-brings-non-line-sight-innovation-wireless-transport#prettyPhoto.
G. H. Elzwawi, H. H. Elzwawi, M. M. Tahseen and T. A. Denidni, "Frequency Selective Surface-Based Switched-Beamforming Antenna," IEEE Access, vol. 6, pp. 48042-48050, Jul. 4, 2018, doi: 10.1109/ACCESS.2018.2850808.
P.H.F. Silva, A.L.P.S. Campos, "Fast and accurate modelling of frequency-selective surfaces using a new modular neural network configuration of multilayer perceptrons", IET Microwaves, Antennas & Propagation, Sep. 2008, 2, (5), pp. 503-511, DOI: 10.1049/iet-map:20080066.
International Search Report (PCT/ISA/210) issued by the International Searching Authority on Aug. 18, 2022 in International Application No. PCT/KR2022/006278.
Written Opinion (PCT/ISA/237) issued by the International Searching Authority on Aug. 18, 2022 in International Application No. PCT/KR2022/006278.
Communication dated Aug. 26, 2025, issued by the Korean Intellectual Property Office in Korean Application No. 10-2021-0103843.

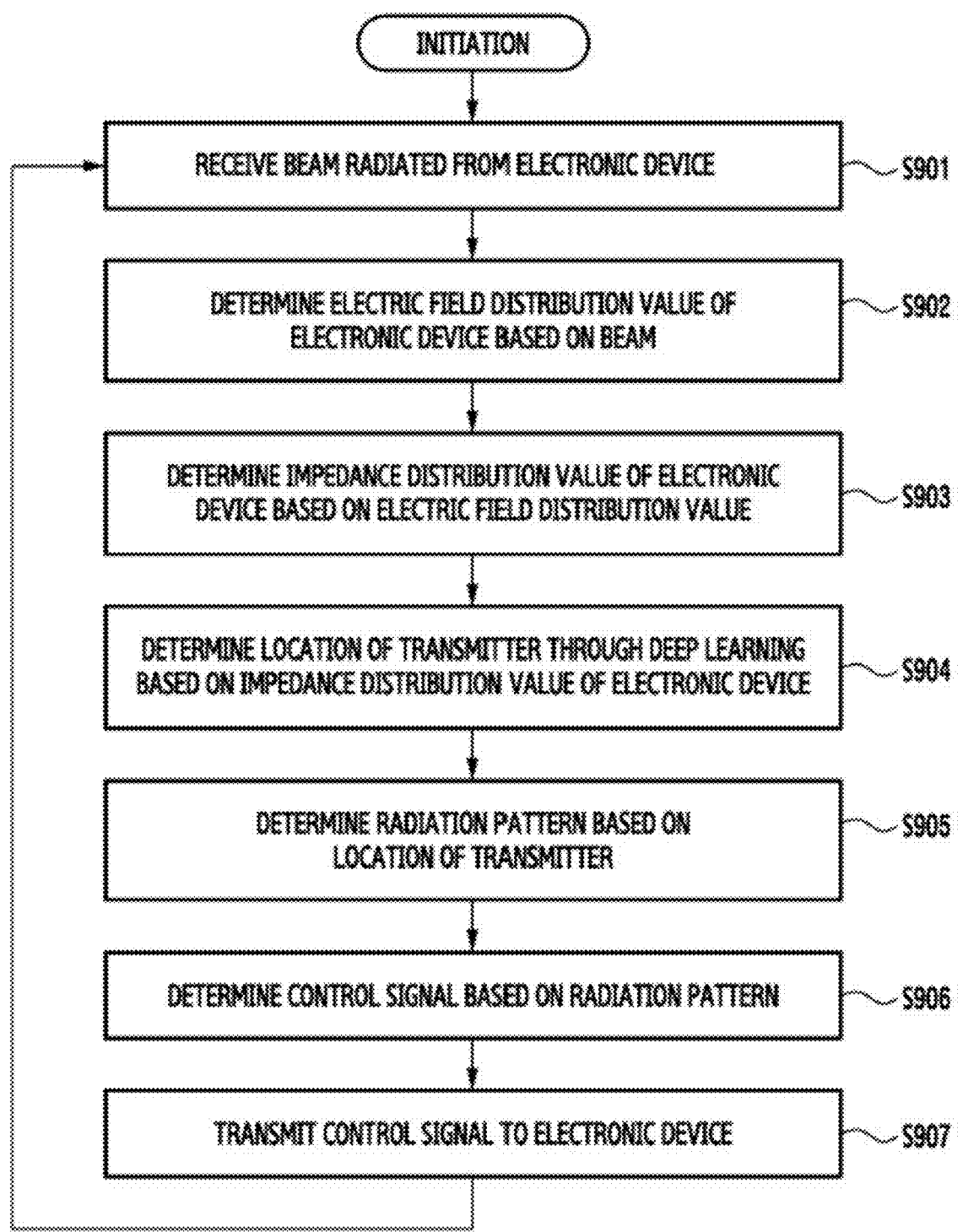

INITIATION

RECEIVE BEAM RADIATED FROM ELECTRONIC DEVICE ~S901

DETERMINE ELECTRIC FIELD DISTRIBUTION VALUE OF
ELECTRONIC DEVICE BASED ON BEAM ~S902

DETERMINE IMPEDANCE DISTRIBUTION VALUE OF ELECTRONIC
DEVICE BASED ON ELECTRIC FIELD DISTRIBUTION VALUE ~S903

DETERMINE LOCATION OF TRANSMITTER THROUGH DEEP LEARNING
BASED ON IMPEDANCE DISTRIBUTION VALUE OF ELECTRONIC DEVICE ~S904

DETERMINE RADIATION PATTERN BASED ON
LOCATION OF TRANSMITTER ~S905

DETERMINE CONTROL SIGNAL BASED ON RADIATION PATTERN ~S906

TRANSMIT CONTROL SIGNAL TO ELECTRONIC DEVICE ~S907

FIG. 9

ELECTRONIC DEVICE INCLUDING A SEMICONDUCTOR ELEMENT ON A GLASS SUBSTRATE, WHERE THE SEMICONDUCTOR ELEMENT IS CONNECTED TO A FEED LINE BY A SECOND PATTERN AND A VIA HOLE

CROSS-REFERENCE TO RELATED APPLICATIONS

This application is a by-pass continuation application of International Application No. PCT/KR2022/006278, filed on May 2, 2022, which is based on and claims priority to Korean Patent Application No. 10-2021-0103843, filed on Aug. 6, 2021, in the Korean Intellectual Property Office, the disclosures of which are incorporated by reference herein their entireties.

BACKGROUND

1. Field

The disclosure relates to an electronic device, and more particularly, to an electronic device including a pattern structure for beamforming and an operating method of the electronic device.

2. Description of Related Art

Fifth generation (5G) mobile communication technology defines a wide frequency band to enable fast transmission speed and new services, and may be implemented in frequency bands which is below 6 GHZ ('Sub 6 GHz') such as 3.5 GHZ, as well as ultra-high frequency bands ('Above 6 GHz') called millimeter waves (mmWave) such as 28 GHz and 39 GHz. In addition, in a case of 6G mobile communication technology, which is called the system after 5G communication (Beyond 5G), implementation in the Terahertz band (e.g., from 95 GHz to 3 Terahertz (3 THz) band) has been considered, which may achieve 50 times faster transmission speed and Ultra Low latency reduced by one-tenth compared to the 5G mobile communication technology.

In the early days of 5G mobile communication technology, aiming to support services and meet performance requirements for enhanced mobile broadband (eMBB), ultra-reliable low-latency communications (URLLC), and massive machine-type communications (mMTC), standardizations of the 5G mobile communication technology were carried out for Beamforming and massive array multiple input multiple output (Massive MIMO) to alleviate path loss of radio waves in the ultra-high frequency band and increase the transmission distance of radio waves, various numerologies support (e.g., multiple subcarrier spacing operations) and dynamic operation of slot formats which are for efficient utilization of ultra-high frequency resources, early access technology for supporting multi-beam transmission and broadband, definition and operation of band-width part (BWP), new channel coding methods such as low density parity check (LDPC) code for large data transmission and polar code for highly reliable transmission of control information, L2 pre-processing, Network Slicing providing a dedicated network specialized for specific services, and the like.

There are ongoing discussions for improvement and enhancement of the initial 5G mobile communication technology, taking into account the services that the 5G mobile communication technology was intended to support, and physical layer standardization for technologies such as vehicle-to-everything (V2X) for helping autonomous vehicles make driving decisions based on their own location and status information transmitted by the vehicle and for increasing user convenience, new radio unlicensed (NR-U) which aims to operate the system in unlicensed bands in compliance with various regulatory requirements, NR terminal low power consumption technology (e.g., User Equipment (UE) power saving), non-terrestrial network (NTN) which is direct terminal-satellite communication to secure coverage in areas where communication with the terrestrial network is impossible, positioning and the like is in progress.

In addition, standardization of the field of wireless interface architecture/protocol for technologies such as Intelligent factory (industrial internet of things, IIoT) for supporting new services through linkage and convergence with other industries, integrated access and backhaul (IAB) which provides nodes for expanding network service areas by integrally supporting wireless backhaul links and access links, mobility enhancement including conditional handover and dual active protocol stack (daps) handover, and 2-step random access (2-step random access channel (RACH) for NR) that simplifies random access procedures, and the like is also in progress, and standardization of the field of system architecture/service for 5G baseline architecture (e.g., Service based Architecture, Service based Interface) for incorporating network functions virtualization (NFV) and software-defined networking (SDN) technologies, mobile edge computing (MEC) which provides services based on the location of the terminal, and the like is also in progress.

When these 5G mobile communication systems are commercialized, connected devices in an explosive growth trend will be connected to the communication network, accordingly, it is expected that strengthening the functions and performance of the 5G mobile communication system and integrated operation of the connected devices will be necessary. To this end, new research on extended reality (XR) for efficiently supporting augmented reality (AR), virtual reality (VR), mixed reality (MR), and the like, improving 5G performance and reducing complexity utilizing artificial intelligence (AI) and machine learning (ML), AI service support, metaverse service support, drone communication, and the like will be conducted.

The development of these 5G mobile communication systems could be the basis for the development of not only multi-antenna transmission technologies such as new waveform, full dimensional MIMO (FD-MIMO), array antenna, and large scale antenna, for ensuring coverage in the terahertz band of the 6G mobile communication technology, and high-dimensional spatial multiplexing technology using metamaterial-based lenses and antennas and orbital angular momentum (OAM) to improve coverage of terahertz band signals, but also Full duplex technology to improve the frequency efficiency of the 6G mobile communication technology and improve system networks, AI-based communication technology that realize system optimization by utilizing satellites and AI from the design stage and internalizing End-to-End AI support functions, next-generation distributed computing technology that realizes services of complexity that exceed the limits of terminal computing capabilities by utilizing ultra-high-performance communication and computing resources, and the like.

SUMMARY OF THE INVENTION

Provided is an electronic device including a pattern structure for reducing reflection transmission loss due to a boundary between outdoors and indoors for a communication signal transmitted from the outdoors and entering the indoors (outdoor-do-indoor).

Provided is an electronic device including a pattern structure capable of transmitting a steered transmission signal from a fixed location of a transmitter to a receiver located in a shadow area for the transmission signal.

Provided is an electronic device including a pattern structure capable of controlling the arbitrary radiation direction of the communication signal transmitted from the outdoors and entering the indoors (outdoor-do-indoor) in a desired direction.

Provided is an electronic device including a patterned structure of a frequency selective surface (FSS) capable of actively changing electrical properties.

Provided is an electronic device including a pattern structure that may be arranged on a glass window made of transparent material and capable of beamforming.

Provided is an electronic device including a pattern structure capable of beamforming.

Provided is an electronic device including a pattern structure implemented in two dimensions.

Provided is an electronic device including a pattern structure implemented in three dimensions.

Provided is an electronic device that generates a control signal for controlling beamforming through an artificial intelligence model (such as a deep learning model).

According to an aspect of the disclosure, an electronic device includes: a glass substrate including a first surface and a second surface opposite to the first surface; a semiconductor element provided on the first surface of the glass substrate; a first pattern provided on the first surface of the glass substrate, the first pattern being electrically connected to a first end of the semiconductor element: a second pattern provided on the first surface of the glass substrate, the second pattern being electrically connected to a second end of the semiconductor element: a feeding line provided on the second surface of the glass substrate; and a via hole which passes through the glass substrate in a first direction, the via hole electrically connecting the feeding line to the second pattern.

The first pattern may have a T shape.

The first pattern may include a first sub-pattern extending in a second direction and a second sub-pattern extending in a third direction.

A first end of the first sub-pattern may be electrically connected to the first end of the semiconductor element, and a second end of the first sub-pattern may be connected to a central portion of the second sub-pattern.

The electronic device may further include a first port electrically connected to the first pattern.

An end of the first port may be electrically connected to an end of the second sub-pattern.

The second pattern may have a T shape.

The second pattern may include a first sub-pattern extending in a second direction and a second sub-pattern extending in a third direction.

A first end of the first sub-pattern may be electrically connected to the second end of the semiconductor element, and a second end of the first sub-pattern may be connected to a central portion of the second sub-pattern.

The central portion of the second sub-pattern may be electrically connected to an end of the via hole.

The electronic device may further include a second port electrically connected to the second pattern, the via hole, and the feeding line.

An end of the second port may be electrically connected to the second sub-pattern.

An end of the second port may be electrically connected to the via hole.

An end of the second port may be electrically connected to the feeding line.

According to an aspect of the disclosure, an electronic device includes: a glass substrate including a first surface and a second surface opposite to the first surface; a semiconductor element provided on the first surface of the glass substrate: a first pattern provided on the first surface of the glass substrate, the first pattern being electrically connected to a first end of the semiconductor element: a second pattern provided on the first surface of the glass substrate, the second pattern being electrically connected to a second end of the semiconductor element: a feeding line provided on the second surface of the glass substrate; a via hole which passes through the glass substrate in a first direction, the via hole electrically connecting the feeding line to the second pattern; and a controller configured to supply an electric signal to the first pattern and the second pattern.

According to an aspect of the disclosure, an electronic device includes a plurality of unit cells and a controller configured to supply electric signals for the unit cells. Each of the unit cells includes a glass substrate comprising a first surface and a second surface opposite to the first surface, a semiconductor element provided on the first surface of the glass substrate, a first pattern provided on the first surface of the glass substrate, a second pattern provided on the first surface of the glass substrate, a feeding line provided on the second surface of the glass substrate, and a via hole which passes through the glass substrate in a first direction. The first pattern is electrically connected to a first end of the semiconductor element and the second pattern is electrically connected to a second end of the semiconductor element. The via hole electrically connects the feeding line to the second pattern.

An electronic device according to one or more embodiments can reduce reflection transmission loss due to the boundary between the outdoors and the indoors for a communication signal transmitted from the outdoors and entering the indoors.

An electronic device according to one or more embodiments can transmit a steered transmission signal from a fixed location of a transmitter to a receiver located in a shadow area for the transmission signal.

An electronic device according to one or more embodiments can control the arbitrary radiation direction of the communication signal transmitted from the outdoors and entering the indoors in a desired direction.

An electronic device according to one or more embodiments can actively change electrical characteristics through a pattern structure of a frequency-selective surface.

An electronic device according to one or more embodiments can be disposed on a glass window made of transparent material and can perform beamforming on a signal passing through the glass window.

An electronic device according to one or more embodiments can facilitate design and manufacturing by being implemented in two dimensions.

An electronic device according to one or more embodiments can increase the phase range by being implemented in three dimensions.

An electronic device according to one or more embodiments can improve the accuracy of beamforming by controlling a beam radiated from the electronic device through a control signal generated through an artificial intelligence model (such as a deep learning model).

BRIEF DESCRIPTION OF THE DRAWINGS

The above and other aspects, features, and advantages of certain embodiments of the disclosure will be more apparent from the following description taken in conjunction with the accompanying drawings, in which:

FIG. 9 is a flowchart illustrating an operation sequence of a controller according to one or more embodiments.

DETAILED DESCRIPTION OF THE INVENTION

Hereinafter, embodiments of the disclosure will be described in detail with reference to the accompanying drawings. In the following description of the disclosure, in case that a detailed description of a related known function or configuration is judged to unnecessarily obscure the gist of the disclosure, the detailed description will be omitted. In addition, the terms to be described later are terms defined in consideration of the functions in the disclosure, and may vary depending on the intention or custom of the user or operator. Therefore, the definition should be made based on the contents throughout the present specification.

Figure 1:
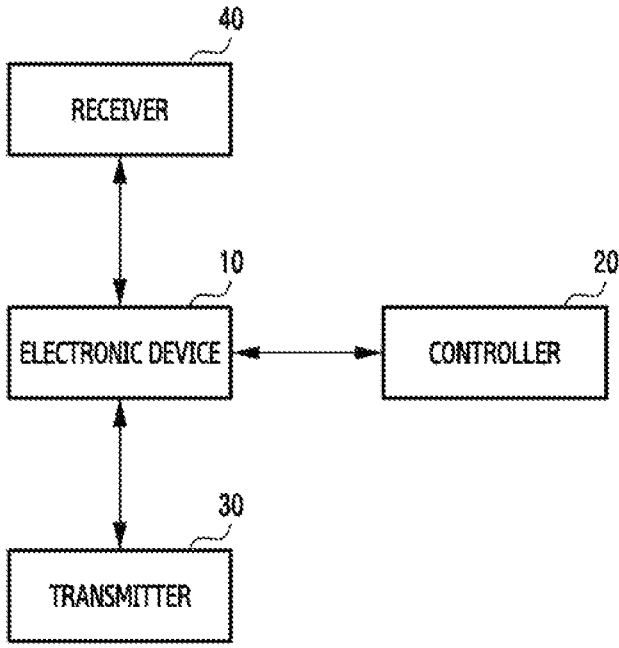
FIG. 1 illustrates a network environment and an electronic device according to one or more embodiments.

FIG. 1 illustrates a network environment and an electronic device according to one or more embodiments.

Referring to FIG. 1, a network environment may include an electronic device 10, a controller 20, a transmitter 30, and a receiver 40. The electronic device 10 according to embodiments may include a pattern structure for beamforming. The electronic device 10 according to embodiments may include the pattern structure and a substrate made of a transparent material on which the pattern structure is mounted. For example, the substrate made of the transparent material may be a glass window.

The transmitter 30 may transmit a transmission signal to the receiver 40. The transmission signal may be transmitted to a surface of the electronic device 10. The transmission signal may pass through the surface of the electronic device 10 and radiate to another surface of the electronic device 10.

The controller 20 may be connected to the electronic device 10 wirelessly or wired. For example, the controller 20 may transmit a control signal for controlling the electromagnetic characteristics of the electronic device 10 to the electronic device 10. The electronic device 10 according to embodiments may include the controller 20.

Figure 2:
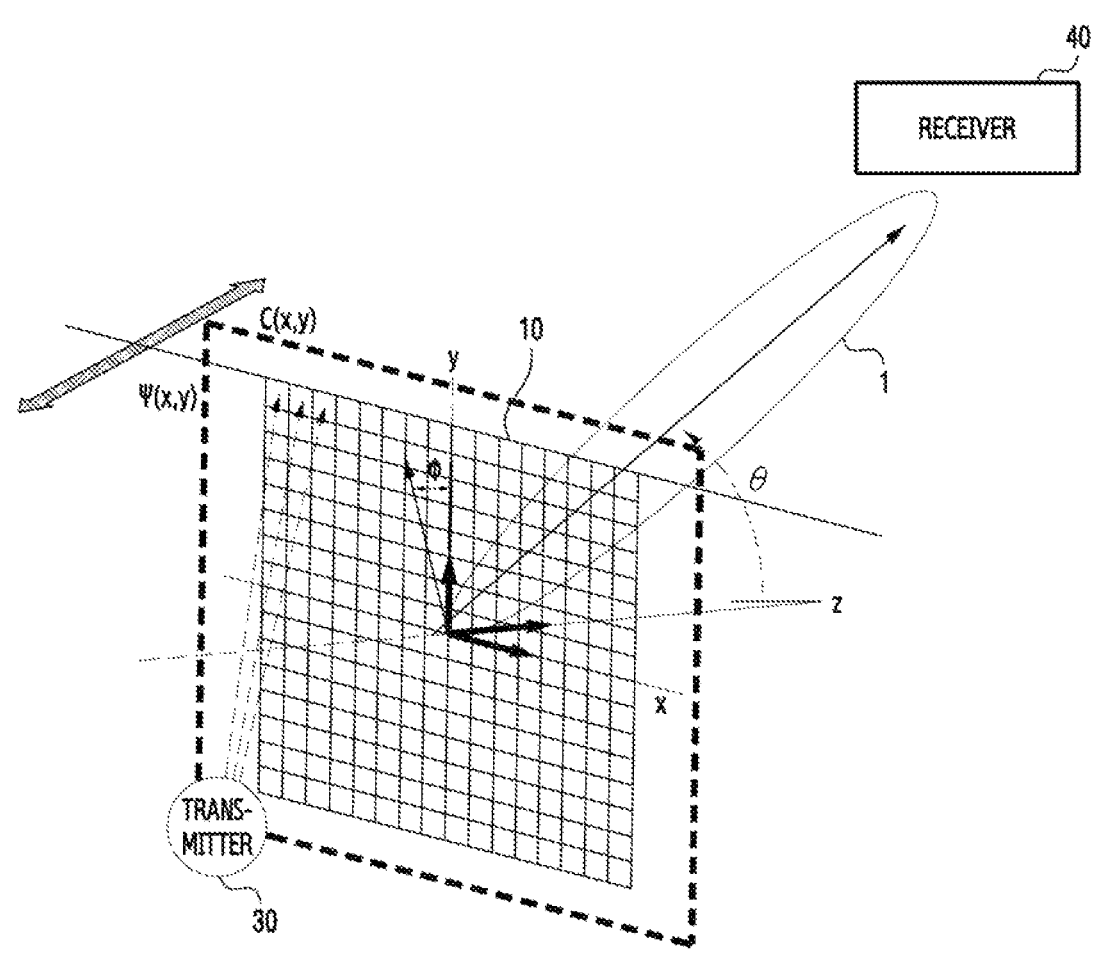
FIG. 2 illustrates a network environment and an electronic device according to one or more embodiments.

FIG. 2 illustrates a network environment and an electronic device according to one or more embodiments.

Referring to FIG. 2, an electronic device 10 may have a substrate shape disposed on an x-y plane. For example, the electronic device 10 may include a pattern structure disposed on a glass window of a building, but is not limited thereto.

A transmitter 30 may be disposed in a direction of a surface of the electronic device 10. For example, the transmitter 30 may be a base station disposed outside a building, but is not limited thereto.

The receiver 40 may be disposed in a direction of another surface of the electronic device 10. For example, the receiver 40 may be a terminal disposed inside a building, but is not limited thereto.

The electronic device 10 may be disposed between the transmitter 30 and the receiver 40. For example, the electronic device 10 may be disposed on a transmission path of a transmission signal transmitted from the transmitter 30.

For example, the transmitter 30 may transmit the transmission signal to the receiver 40 disposed indoors of the building. For example, the transmission signal transmitted from the transmitter 30 to the receiver 40 may pass through the electronic device 10. For example, the transmission signal transmitted from the transmitter 30 may enter the surface of the electronic device 10 and exit to the other surface of the electronic device 10.

For example, the direction of the beam 1 radiated from the other surface of the electronic device 10 may be determined according to the electromagnetic characteristics of the electronic device 10. For example, the direction of the beam 1 may be expressed as a θ value based on the z-axis and a Φ value based on the y-axis.

For example, the direction of the beam 1 radiated from the other surface of the electronic device 10 may be determined according to the radiation pattern value of the beam 1. For example, the radiation pattern value of the beam 1 may be expressed as $G(\Phi, \theta)$.

For example, the radiation pattern value of the beam 1 may be determined according to the electromagnetic characteristics of the electronic device 10. For example, the electromagnetic characteristics of the electronic device 10 may include a phase distribution value and an impedance distribution value of the electric field (E-field) of the electronic device 10. For example, the phase distribution value of the E-field may be expressed as $\psi(x, y)$. The impedance distribution value may be expressed as $C(x, y)$. For example, the phase distribution value of the E-field may be determined based on the transmission signal entering the surface of the electronic device 10. The impedance distribution value may be determined based on the phase distribution value of the E-field. The radiation pattern value may be determined based on the impedance distribution value.

For example, the electronic device 10 may receive a control signal from the controller 20. The electromagnetic characteristics of the electronic device 10 may be determined based on the control signal. For example, the direction of the beam 1 may be determined according to the control signal.

Figure 3:
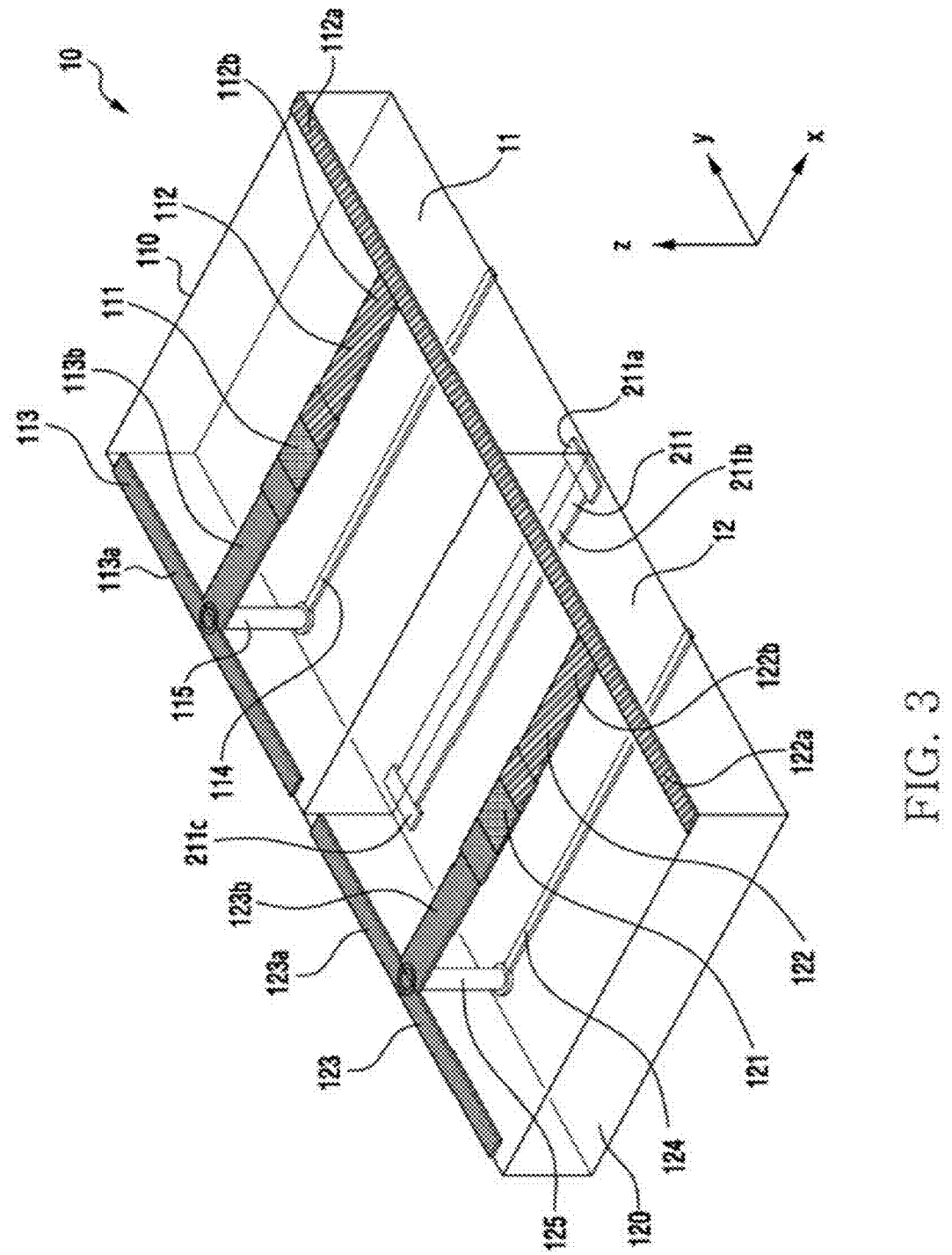
FIG. 3 is a perspective view of an electronic device according to one or more embodiments.

FIG. 3 is a perspective view of an electronic device 10 according to one or more embodiments.

Referring to FIG. 3, the electronic device 10 may include a first cell unit 11 and a second cell unit 12.

The first cell unit 11 may include a first substrate 110. The first substrate 110 may be a transparent material. For example, the first substrate 110 may be glass. A semiconductor element 111, a first pattern 112, and a second pattern 113 may be disposed on a top surface of the first substrate 110. For example, the semiconductor element 111, the first pattern 112, and the second pattern 113 may be referred to as an I-shaped pattern.

The semiconductor element 111 may be disposed on the top surface of the first substrate 110. For example, the semiconductor element 111 may be disposed in the central portion of the top surface of the first substrate 110. An end of the semiconductor element 111 may be electrically connected to the first pattern 112. Another end of the semiconductor element 111 may be electrically connected to the second pattern 113. The semiconductor element 111 may control the capacitance of the RLC circuit formed in the first cell unit 11. For example, the semiconductor element 111 may control the impedance of the first cell unit 11 by controlling the capacitance of the RLC circuit formed in the first cell unit 11.

The first pattern 112 may be disposed on the top surface of the first substrate 110. A first end of the first pattern 112 may be electrically connected to the end of the semiconductor element 111. The first pattern 112 may have a T shape. The first pattern 112 may include a type 1-a pattern 112a and a type 1-b pattern 112b. The type 1-a pattern 112a may be disposed on a side of the top surface of the first substrate 110. The type 1-b pattern 112b may extend from the central portion of the type 1-a pattern 112a toward the semiconductor element 111. For example, the type 1-b pattern 112b may be disposed between the type 1-a pattern 112a and the semiconductor element 111. For example, an end of the type 1-b pattern 112b may be electrically connected to the end of the semiconductor element 111. Another end of the type 1-b pattern 112b may be connected to the central portion of the type 1-a pattern 112a.

The second pattern 113 may be disposed on the top surface of the first substrate 110. A first end of the second pattern 113 may be electrically connected to the other end of the semiconductor element 111. The second pattern 113 may have the T shape. The second pattern 113 may include a type 2-a pattern 113a and a type 2-b pattern 113b. The type 2-a pattern 113a may have a shape extending in the y-axis. The type 2-a pattern 113a may be disposed on another side of the top surface of the first substrate 110. The type 2-b pattern 113b may have a shape extending in the x-axis. For example, the type 2-b pattern 113b may extend from the central portion of the type 2-a pattern 113a toward the semiconductor element 111. For example, the type 2-b pattern 113b may be disposed between the type 2-a pattern 113a and the semiconductor element 111. For example, an end of the type 2-b pattern 113b may be electrically connected to the other end of the semiconductor element 111. Another end of the type 2-b pattern 113b may be connected to the central portion of the type 2-a pattern 112a.

A conductive line 114 may be disposed on a bottom surface of the first substrate 110. The conductive line 114 may be referred to as a feeding line or biasing line. The conductive line 114 may have a shape extending in the x-axis on the bottom surface of the first substrate 110. For example, the conductive line 114 may be disposed to be symmetrical to the type 1-b pattern 112b and the type 2-b pattern 113b with respect to the first substrate 110. For example, the conductive line 114 may be disposed to be parallel to the type 1-b pattern 112b with respect to the first substrate 110. The conductive line 114 may be disposed to be parallel to the type 2-b pattern 113b with respect to the first substrate 110.

A via hole 115 may be formed in an area of the first substrate 110. For example, the via hole 115 may penetrate an area on the y-axis of the first substrate 110. An end of the via hole 115 may be electrically connected to the second pattern 113. For example, the end of the via hole 115 may be electrically connected to the central portion of the type 2-b pattern 113. Another end of the via hole 115 may be electrically connected to the conductive line 114. For example, the other end of the via hole 115 may be electrically connected to an end of the conductive line 114. For example, the via hole 115 may include a conductive material. For example, the via hole 115 may be filled with the conductive material.

The second cell unit 12 may include a second substrate 120. The second substrate 120 may be a transparent material. The second substrate 120 may be disposed adjacent to the first substrate 110 on the x-y plane. The second substrate 120 may be coupled to the first substrate 110. For example, a side surface of the second substrate 120 may be coupled to a side surface of the first substrate 110. For example, the second substrate 120 may be glass. A semiconductor element 121, a first pattern 122, and a second pattern 123 may be disposed on a top surface of the second substrate 120.

The semiconductor element 121 may be disposed on the top surface of the second substrate 120. For example, the semiconductor element 121 may be disposed in the central portion of the top surface of the second substrate 120. An end of the semiconductor element 121 may be electrically connected to the first pattern 122. Another end of the semiconductor element 121 may be electrically connected to the second pattern 123. The semiconductor element 121 may control the capacitance of the RLC circuit formed in the second cell unit 12. For example, the semiconductor element 121 may control the impedance of the second cell unit 12 by controlling the capacitance of the RLC circuit formed in the second cell unit 12.

The first pattern 122 may be disposed on the top surface of the second substrate 120. A first end of the first pattern 122 may be electrically connected to the end of the semiconductor element 121. The first pattern 122 may have the T shape. The first pattern 122 may include a type 1-a pattern 122a and a type 1-b pattern 122b. The type 1-a pattern 122a may be disposed on a side of the top surface of the second substrate 120. The type 1-b pattern 122b may extend from the central portion of the type 1-a pattern 122a toward the semiconductor element 121. For example, the type 1-b pattern 122b may be disposed between the type 1-a pattern 122a and the semiconductor element 121. For example, an end of the type 1-b pattern 122b may be electrically connected to the end of the semiconductor element 121. Another end of the type 1-b pattern 122b may be connected to the central portion of the type 1-a pattern 122a.

The second pattern 123 may be disposed on the top surface of the second substrate 120. A first end of the second pattern 123 may be electrically connected to the other end of the semiconductor element 121. The second pattern 123 may have the T shape. The second pattern 123 may include a type 2-a pattern 123a and a type 2-b pattern 123b. The type 2-a pattern 123a may have the shape extending in the y-axis. The type 2-a pattern 123a may be disposed on another side of the top surface of the second substrate 120. The type 2-b pattern 123b may have the shape extending in the x-axis. For example, the type 2-b pattern 123b may extend from the central portion of the type 2-a pattern 123a toward the semiconductor element 121. For example, the type 2-b pattern 123b may be disposed between the type 2-a pattern 123a and the semiconductor element 121. For example, an end of the type 2-b pattern 123b may be electrically connected to the other end of the semiconductor element 121.

Another end of the type 2-b pattern 123*b* may be connected to the central portion of the type 2-a pattern 122*a*.

A conductive line 124 may be disposed on a bottom surface of the second substrate 120. The conductive line 124 may have the shape extending in the x-axis on the bottom surface of the second substrate 12. For example, the conductive line 124 may be disposed to be symmetrical to the type 1-b pattern 122*b* and the type 2-b pattern 123*b* with respect to the second substrate 12. For example, the conductive line 124 may be disposed to be parallel to the type 1-b pattern 122*b* with respect to the second substrate 120. The conductive line 124 may be disposed to be parallel to the type 2-b pattern 123*b* with respect to the second substrate 120.

A via hole 125 may be formed in an area of the second substrate 120. For example, the via hole 125 may penetrate an area on the y-axis of the second substrate 120. An end of the via hole 125 may be electrically connected to the second pattern 123. For example, the end of the via hole 125 may be electrically connected to the central portion of the type 2-b pattern 123. Another end of the via hole 125 may be electrically connected to the conductive line 124. For example, the other end of the via hole 125 may be electrically connected to an end of the conductive line 124.

A third pattern 211 may be disposed on an area of the bottom surface of the first substrate 110 and an area of the bottom surface of the second substrate 120. The third pattern 211 may be disposed over the area of the bottom surface of the first substrate 110 and the area of the bottom surface of the second substrate 120. The third pattern 211 may have a shape extending in an x-axis direction. The third pattern 211 may be disposed between the conductive line 114 disposed on the bottom surface of the first substrate 110 and the conductive line 124 disposed on the bottom surface of the second substrate 120. For example, the third pattern 211 may be disposed to be spaced apart from the conductive line 114 by a predetermined distance. For example, the third pattern 211 may be disposed to be parallel to the conductive line 114. For example, the third pattern 211 may be disposed to be parallel to the conductive line 124. For example, the third pattern 211 may be disposed to be spaced apart from the conductive line 124 by a predetermined distance.

The third pattern 211 may be referred to as the I-shaped pattern. For example, the third pattern 211 may include a type 3-a pattern 211*a*, a type 3-b pattern 211*b*, and a type 3-c pattern 211*c*. The type 3-b pattern 211*b* may have the shape extending in the x-axis direction. An end of the type 3-b pattern 211*b* may be connected to the type 3-a pattern 211*a*. Another end of the type 3-b pattern 211*b* may be connected to the type 3-c pattern 211*c*. The type 3-a pattern 211*a* may have a shape extending in a y-axis direction. The type 3-c pattern 211*c* may have the shape extending in the y-axis direction. The type 3-a pattern 211*a* and the type 3-c pattern 211*c* may be disposed to be symmetrical to each other with respect to the type 3-b pattern 211*b*.

Figure 4:
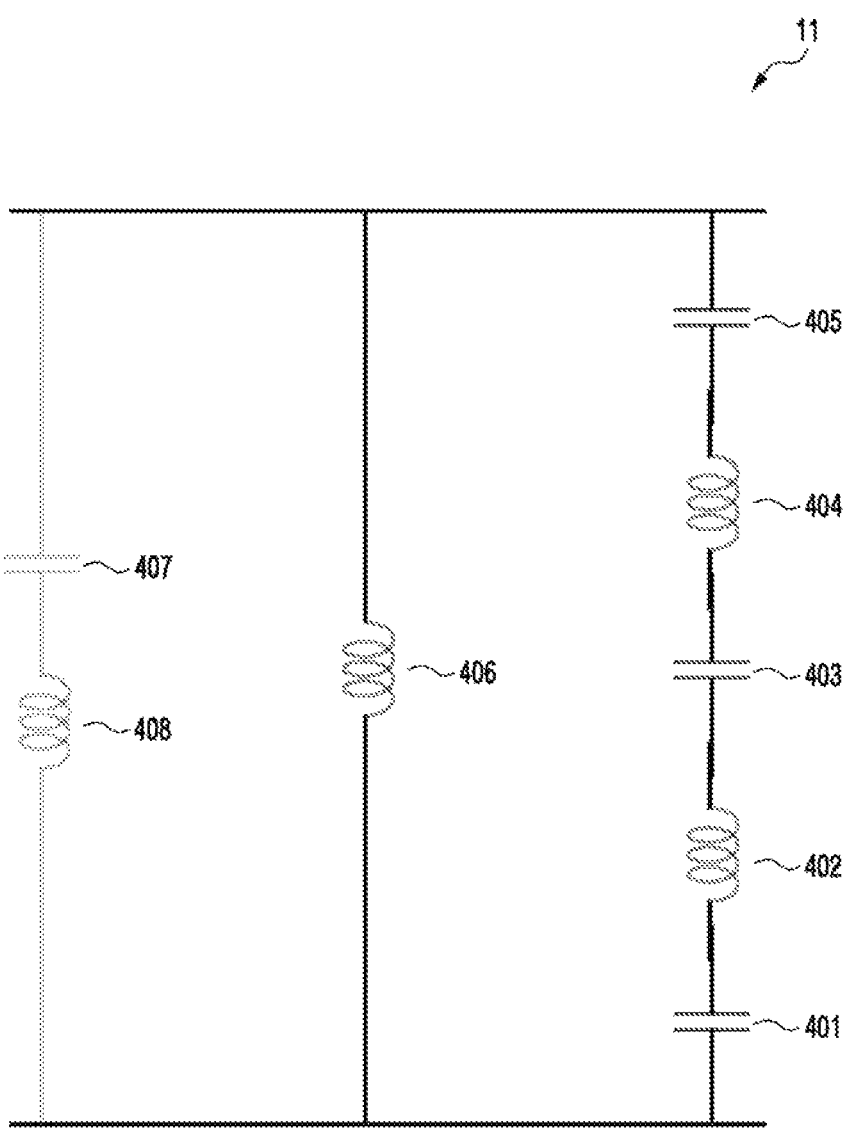
FIG. 4 illustrates an equivalent circuit of an electronic device according to one or more embodiments.

FIG. 4 illustrates an equivalent circuit of an electronic device 10 according to one or more embodiments.

Referring to FIG. 4, at least one cell unit of the electronic device 10 may include a plurality of capacitance components 401, 403, 405, and 407 and a plurality of inductance components 402, 404, 406, and 408.

The capacitance component 407 may be connected in series with the inductance component 408. For example, an end of the capacitance component 407 may be connected in series with another end of the inductance component 408.

The inductance component 406 may be connected in parallel with the capacitance component 407 and the inductance component 408. For example, an end of the inductance component 406 may be connected in parallel with an end of the inductance component 408. Another end of the inductance component 406 may be connected in parallel with another end of the capacitance component 407.

The capacitance component 401, the inductance component 402, the capacitance component 403, the inductance component 404, and the capacitance component 405 may be connected in series. For example, an end of the capacitance component 405 may be connected in series with another end of the inductance component 404. An end of the inductance component 404 may be connected in series with another end of the capacitance component 403. An end of the capacitance component 403 may be connected in series with another end of the inductance component 402. An end of the inductance component 402 may be connected in series with another end of the capacitance component 401.

The inductance component 406 may be connected in parallel with the capacitance component 401, the inductance component 402, the capacitance component 403, the inductance component 404, and the capacitance component 405. For example, the end of the inductance component 406 may be connected in parallel with an end of the capacitance component 401. The other end of the inductance component 406 may be connected in parallel with another end of the capacitance component 405.

For example, the capacitance component 401 may be formed in a type 1-a pattern 112*a*. The inductance component 402 may be formed in a type 1-b pattern 112*b*. The capacitance component 405 may be formed in a type 2-a pattern 113*a*. The inductance component 404 may be formed in a type 2-b pattern 113*b*. The capacitance component 403 may be formed in a semiconductor element 111. For example, the semiconductor element 111 may be a varactor diode. For example, a first cell unit 11 may control the capacitance component 403 through the semiconductor element 111. For example, a signal for controlling the capacitance component 403 may be transmitted to the semiconductor element 111 through a conductive line 114, a via hole 115, and the type 2-b pattern 113. For example, the same voltage may be applied to the type 1-a pattern and the type 2-a pattern of each of the cell units disposed in the x-axis direction. Based on a signal radiated from a transmitter 30 and passing through the electronic device 10, the disposition direction of the conductive line 114 may be the same or similar to the direction of the E-field. The inductance component 406 may be formed in the conductive line 114.

For example, the type 1-a pattern of each of cell units disposed in the y-axis direction may be electrically connected to each other. The same voltage may be applied to the type 1-a pattern of each of the cell units disposed in the y-axis direction.

The capacitance component 407 and the inductance component 408 may be formed in a third pattern 211. The electronic device 10 may radiate a signal of a specific frequency through a plurality of third patterns disposed in a plurality of cell units. For example, the specific frequency may be 28 GHz, but is not limited thereto. The plurality of third patterns may generate double resonance. For example, the plurality of third patterns may be disposed adjacent to each other in the x-axis direction. For example, the capacitance component 407 may be formed in the plurality of third patterns disposed adjacent to each other in the x-axis direction. For example, the plurality of third patterns may have a series LC structure. The disposition direction of the third pattern 211 may be parallel to the direction of the E-field.

Figure 5:
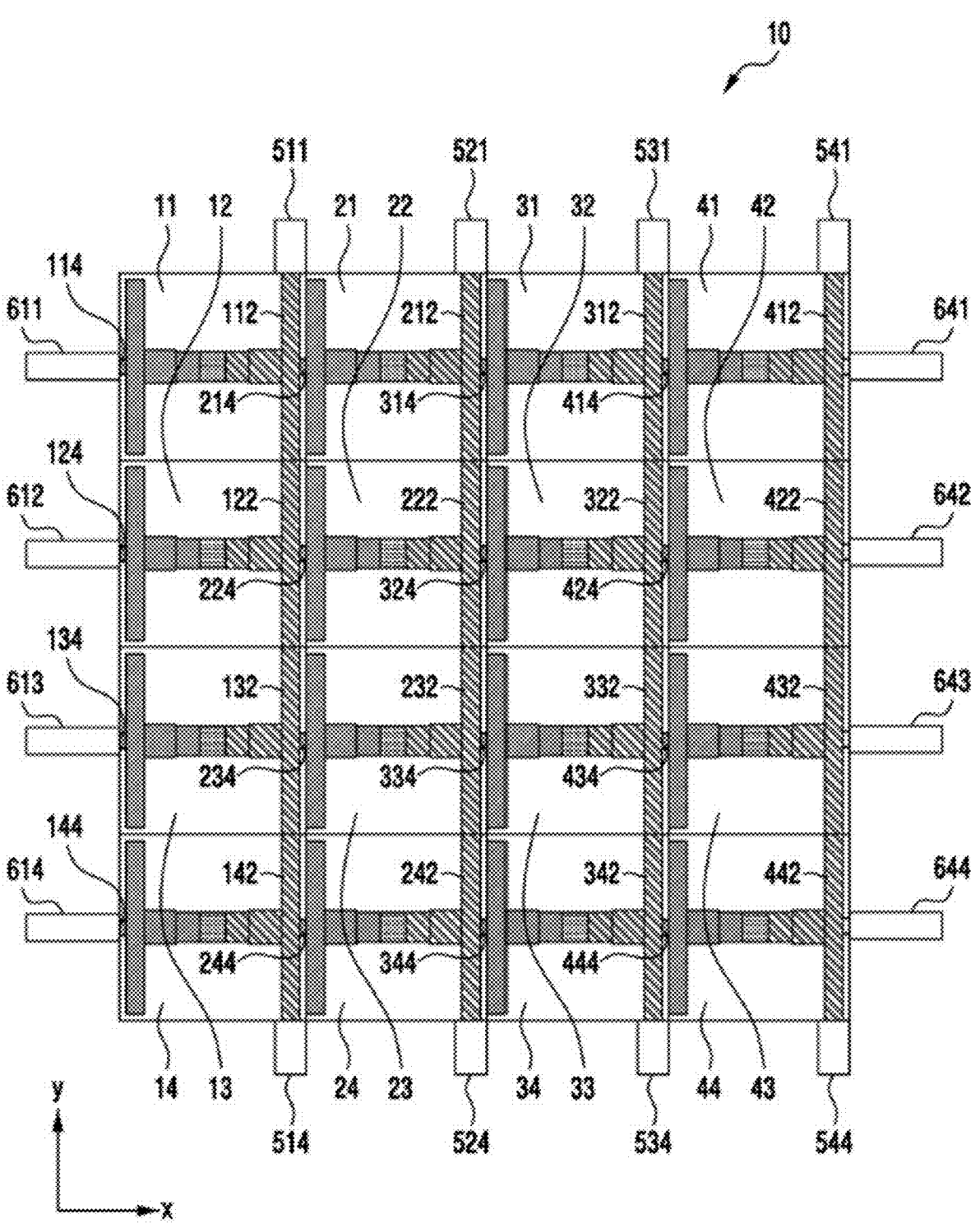
FIG. 5 illustrates a top surface of an electronic device according to one or more embodiments.

FIG. 5 illustrates a top surface of an electronic device according to one or more embodiments.

Referring to FIG. 5, the electronic device 10 may further include a plurality of cell units 13, 14, 21, 22, 23, 24, 31, 32, 33, 34, 41, 42, 43, and 44.

For example, the plurality of cell units 13, 14, 21, 22, 23, 24, 31, 32, 33, 34, 41, 42, 43, and 44 may be disposed on an x-y plane. For example, the x-axis may be referred to as a first direction. The y-axis may be referred to as a second direction. For example, the first direction may be divided into a first row, a second row, a third row, and a fourth row based on the first cell unit 11. For example, the second direction may be divided into a first column, a second column, a third column, and a fourth column based on the first cell unit 11.

The type 1-1 cell unit 11, the type 2-1 cell unit 21, the type 3-1 cell unit 31, and the type 4-1 cell unit 41 may be disposed in the first row.

The type 1-1 cell unit 11 may be disposed adjacent to the type 2-1 cell unit 21 in the first direction. A conductive line 114 of the type 1-1 cell unit 11 may be electrically connected to a conductive line 214 of the type 2-1 cell unit 21. For example, another end of the conductive line 114 of the type 1-1 cell unit 11 may be electrically connected to an end of the conductive line 214 of the type 2-1 cell unit 21.

The type 2-1 cell unit 21 may be disposed adjacent to the type 3-1 cell unit 31 in the first direction. The conductive line 214 of the type 2-1 cell unit 21 may be electrically connected to a conductive line 314 of the type 3-1 cell unit 31. For example, another end of the conductive line 214 of the type 2-1 cell unit 21 may be electrically connected to an end of the conductive line 314 of the type 3-1 cell unit 31.

The type 3-1 cell unit 31 may be disposed adjacent to the type 4-1 cell unit 41 in the first direction. The conductive line 314 of the type 3-1 cell unit 31 may be electrically connected to a conductive line 414 of the type 4-1 cell unit 41. For example, another end of the conductive line 314 of the type 3-1 cell unit 31 may be electrically connected to an end of the conductive line 414 of the type 4-1 cell unit 41.

The type 1-2 cell unit 12, the type 2-2 cell unit 22, the type 3-2 cell unit 32, and the type 4-2 cell unit 42 may be disposed in the first row.

The type 1-2 cell unit 12 may be disposed adjacent to the type 2-2 cell unit 22 in the first direction. A conductive line 124 of the type 1-2 cell unit 12 may be electrically connected to a conductive line 224 of the type 2-2 cell unit 22. For example, another end of the conductive line 124 of the type 1-2 cell unit 12 may be electrically connected to an end of the conductive line 224 of the type 2-2 cell unit 22.

The type 2-2 cell unit 22 may be disposed adjacent to the type 3-2 cell unit 32 in the first direction. The conductive line 224 of the type 2-2 cell unit 22 may be electrically connected to a conductive line 324 of the type 3-2 cell unit 32. For example, another end of the conductive line 224 of the type 2-2 cell unit 22 may be electrically connected to an end of the conductive line 324 of the type 3-2 cell unit 32.

The type 3-2 cell unit 32 may be disposed adjacent to the type 4-2 cell unit 42 in the first direction. The conductive line 324 of the type 3-2 cell unit 32 may be electrically connected to a conductive line 424 of the type 4-2 cell unit 42. For example, another end of the conductive line 324 of the type 3-2 cell unit 32 may be electrically connected to an end of the conductive line 424 of the type 4-2 cell unit 42.

The type 1-3 cell unit 13, the type 2-3 cell unit 23, the type 3-3 cell unit 33, and the type 4-3 cell unit 43 may be disposed in the first row.

The type 1-3 cell unit 13 may be disposed adjacent to the type 2-3 cell unit 23 in the first direction. A conductive line 134 of the type 1-3 cell unit 13 may be electrically connected to a conductive line 234 of the type 2-3 cell unit 23. For example, another end of the conductive line 134 of the type 1-3 cell unit 13 may be electrically connected to an end of the conductive line 234 of the type 2-3 cell unit 23.

The type 2-3 cell unit 23 may be disposed adjacent to the type 3-3 cell unit 33 in the first direction. The conductive line 234 of the type 2-3 cell unit 23 may be electrically connected to a conductive line 334 of the type 3-3 cell unit 33. For example, another end of the conductive line 234 of the type 2-3 cell unit 23 may be electrically connected to an end of the conductive line 334 of the type 3-3 cell unit 33.

The type 3-3 cell unit 33 may be disposed adjacent to the type 4-3 cell unit 43 in the first direction. The conductive line 334 of the type 3-3 cell unit 33 may be electrically connected to a conductive line 434 of the type 4-3 cell unit 43. For example, another end of the conductive line 334 of the type 3-3 cell unit 33 may be electrically connected to an end of the conductive line 434 of the type 4-3 cell unit 43.

The type 1-4 cell unit 14, the type 2-4 cell unit 24, the type 3-4 cell unit 34, and the type 4-4 cell unit 44 may be disposed in the first row.

The type 1-4 cell unit 14 may be disposed adjacent to the type 2-4 cell unit 24 in the first direction. A conductive line 144 of the type 1-4 cell unit 14 may be electrically connected to a conductive line 244 of the type 2-4 cell unit 24. For example, another end of the conductive line 144 of the type 1-4 cell unit 14 may be electrically connected to an end of the conductive line 244 of the type 2-4 cell unit 24.

The type 2-4 cell unit 24 may be disposed adjacent to the type 3-4 cell unit 34 in the first direction. The conductive line 244 of the type 2-4 cell unit 24 may be electrically connected to a conductive line 344 of the type 3-4 cell unit 34. For example, another end of the conductive line 244 of the type 2-4 cell unit 24 may be electrically connected to an end of the conductive line 344 of the type 3-4 cell unit 34.

The type 3-4 cell unit 34 may be disposed adjacent to the type 4-4 cell unit 44 in the first direction. The conductive line 344 of the type 3-4 cell unit 34 may be electrically connected to a conductive line 444 of the type 4-4 cell unit 44. For example, another end of the conductive line 344 of the type 3-4 cell unit 34 may be electrically connected to an end of the conductive line 444 of the type 4-4 cell unit 44.

The type 1-1 cell unit 11, the type 1-2 cell unit 12, the type 1-3 cell unit 13, and the type 1-4 cell unit 14 may be disposed in the first column. The type 1-1 cell unit 11 may be disposed adjacent to the type 1-2 cell unit 12 in the second direction.

The type 1-2 cell unit 12 may be disposed adjacent to the type 1-3 cell unit 13 in the second direction. The first pattern 122 of the type 1-2 cell unit 12 may be electrically connected to a first pattern 132 of the type 1-3 cell unit 13. For example, a third end of the first pattern 122 of the type 1-2 cell unit 12 may be electrically connected to a second end of the first pattern 132 of the type 1-3 cell unit 13.

The type 1-3 cell unit 13 may be disposed adjacent to the type 1-4 cell unit 14 in the second direction. The first pattern 132 of the type 1-3 cell unit 13 may be electrically connected to a first pattern 142 of the type 1-4 cell unit 14. For example, a third end of the first pattern 132 of the type 1-3 cell unit 13 may be electrically connected to a second end of the first pattern 142 of the type 1-4 cell unit 14.

The type 2-1 cell unit 21, the type 2-2 cell unit 22, the type 2-3 cell unit 23, and the type 2-4 cell unit 24 may be disposed in the second column.

The type 2-1 cell unit 21 may be disposed adjacent to the type 2-2 cell unit 22 in the second direction. For example, a third end of a first pattern 212 of the type 2-1 cell unit 21 may be electrically connected to a second end of a first pattern 222 of the type 2-2 cell unit 22.

The type 2-2 cell unit 22 may be disposed adjacent to the type 2-3 cell unit 23 in the second direction. The first pattern 222 of the type 2-2 cell unit 22 may be electrically connected to a first pattern 232 of the type 2-3 cell unit 23. For example, a third end of the first pattern 222 of the type 2-2 cell unit 22 may be electrically connected to a second end of the first pattern 232 of the type 2-3 cell unit 23.

The type 2-3 cell unit 23 may be disposed adjacent to the type 2-4 cell unit 24 in the second direction. The first pattern 232 of the type 2-3 cell unit 23 may be electrically connected to a first pattern 242 of the type 2-4 cell unit 24. For example, a third end of the first pattern 232 of the type 2-3 cell unit 23 may be electrically connected to a second end of the first pattern 242 of the type 2-4 cell unit 24.

The type 3-1 cell unit 31, the type 3-2 cell unit 32, the type 3-3 cell unit 33, and the type 3-4 cell unit 34 may be disposed in the third column.

The type 3-1 cell unit 31 may be disposed adjacent to the type 3-2 cell unit 32 in the second direction. A first pattern 312 of the type 3-1 cell unit 31 may be electrically connected to a first pattern 322 of the type 3-2 cell unit 32. For example, a third end of the first pattern 312 of the type 3-1 cell unit 31 may be electrically connected to a second end of the first pattern 322 of the type 3-2 cell unit 32.

The type 3-2 cell unit 32 may be disposed adjacent to the type 3-3 cell unit 33 in the second direction. The first pattern 322 of the type 3-2 cell unit 32 may be electrically connected to a first pattern 332 of the type 3-3 cell unit 33. For example, a third end of the first pattern 322 of the type 3-2 cell unit 32 may be electrically connected to a second end of the first pattern 332 of the type 3-3 cell unit 33.

The type 3-3 cell unit 33 may be disposed adjacent to the type 3-4 cell unit 34 in the second direction. The first pattern 332 of the type 3-3 cell unit 33 may be electrically connected to a first pattern 342 of the type 3-4 cell unit 34. For example, a third end of the first pattern 332 of the type 3-3 cell unit 33 may be electrically connected to a second end of the first pattern 342 of the type 3-4 cell unit 34.

The type 4-1 cell unit 41, the type 4-2 cell unit 42, the type 4-3 cell unit 43, and the type 4-4 cell unit 44 may be disposed in the fourth column.

The type 4-1 cell unit 41 may be disposed adjacent to the type 4-2 cell unit 42 in the second direction. A first pattern 412 of the type 4-1 cell unit 41 may be electrically connected to a first pattern 422 of the type 4-2 cell unit 42. For example, a third end of the first pattern 412 of the type 4-1 cell unit 41 may be electrically connected to a second end of the first pattern 422 of the type 4-2 cell unit 42.

The type 4-2 cell unit 42 may be disposed adjacent to the type 4-3 cell unit 43 in the second direction. The first pattern 422 of the type 4-2 cell unit 42 may be electrically connected to a first pattern 432 of the type 4-3 cell unit 43. A third end of the first pattern 422 of the type 4-2 cell unit 42 may be electrically connected to a second end of the first pattern 432 of the type 4-3 cell unit 43.

The type 4-3 cell unit 43 may be disposed adjacent to the type 4-4 cell unit 44 in the second direction. The first pattern 432 of the type 4-3 cell unit 43 may be electrically connected to a first pattern 442 of the type 4-4 cell unit 44. For example, a third end of the first pattern 432 of the type 4-1 cell unit 43 may be electrically connected to a second end of the first pattern 442 of the type 4-4 cell unit 44.

The electronic device 10 may further include a plurality of first ports 511, 521, 531, 541, 514, 524, 534, and 544, and a plurality of second ports 611, 612, 613, 614, 641, 642, 643, and 644.

For example, the first port 511 may be electrically connected to the type 1-1 cell unit 11. For example, an end of the first port 511 may be electrically connected to a second end of the first pattern 112 of the type 1-1 cell unit 11. Another end of the first port 511 may be electrically connected to a controller 20. The type 1-1 cell unit 11 may receive an electrical signal from the controller 20 through the first port 511.

The first port 521 may be electrically connected to the type 2-1 cell unit 21. For example, an end of the first port 521 may be electrically connected to a second end of the first pattern 212 of the type 2-1 cell unit 21. Another end of the first port 521 may be electrically connected to the controller 20. The type 2-1 cell unit 21 may receive the electrical signal from the controller 20 through the first port 521.

The first port 531 may be electrically connected to the type 3-1 cell unit 31. For example, an end of the first port 531 may be electrically connected to a second end of the first pattern 312 of the type 3-1 cell unit 31. Another end of the first port 531 may be electrically connected to the controller 20. The type 3-1 cell unit 31 may receive the electrical signal from the controller 20 through the first port 531.

The first port 541 may be electrically connected to the type 4-1 cell unit 41. For example, an end of the first port 541 may be electrically connected to a second end of the first pattern 412 of the type 4-1 cell unit 41. Another end of the first port 541 may be electrically connected to the controller 20. The type 4-1 cell unit 41 may receive the electrical signal from the controller 20 through the first port 541.

The first port 514 may be electrically connected to the type 1-4 cell unit 14. For example, an end of the first port 514 may be electrically connected to the second end of the first pattern 142 of the type 1-4 cell unit 14. Another end of the first port 514 may be electrically connected to the controller 20. The type 4-1 cell unit 41 may receive the electrical signal from the controller 20 through the first port 541.

The first port 524 may be electrically connected to the type 2-4 cell unit 24. For example, an end of the first port 524 may be electrically connected to the second end of the first pattern 242 of the type 2-4 cell unit 24. Another end of the first port 524 may be electrically connected to the controller 20. The type 2-4 cell unit 24 may receive the electrical signal from the controller 20 through the first port 524.

The first port 534 may be electrically connected to the type 3-4 cell unit 34. For example, an end of the first port 534 may be electrically connected to the second end of the first pattern 342 of the type 3-4 cell unit 34. Another end of the first port 534 may be electrically connected to the controller 20. The type 3-4 cell unit 34 may receive the electrical signal from the controller 20 through the first port 534.

The first port 544 may be electrically connected to the type 4-4 cell unit 44. For example, an end of the first port 544 may be electrically connected to the second end of the first pattern 442 of the type 4-4 cell unit 44. Another end of the first port 544 may be electrically connected to the controller 20. The type 4-4 cell unit 44 may receive the electrical signal from the controller 20 through the first port 544.

Figure 6:
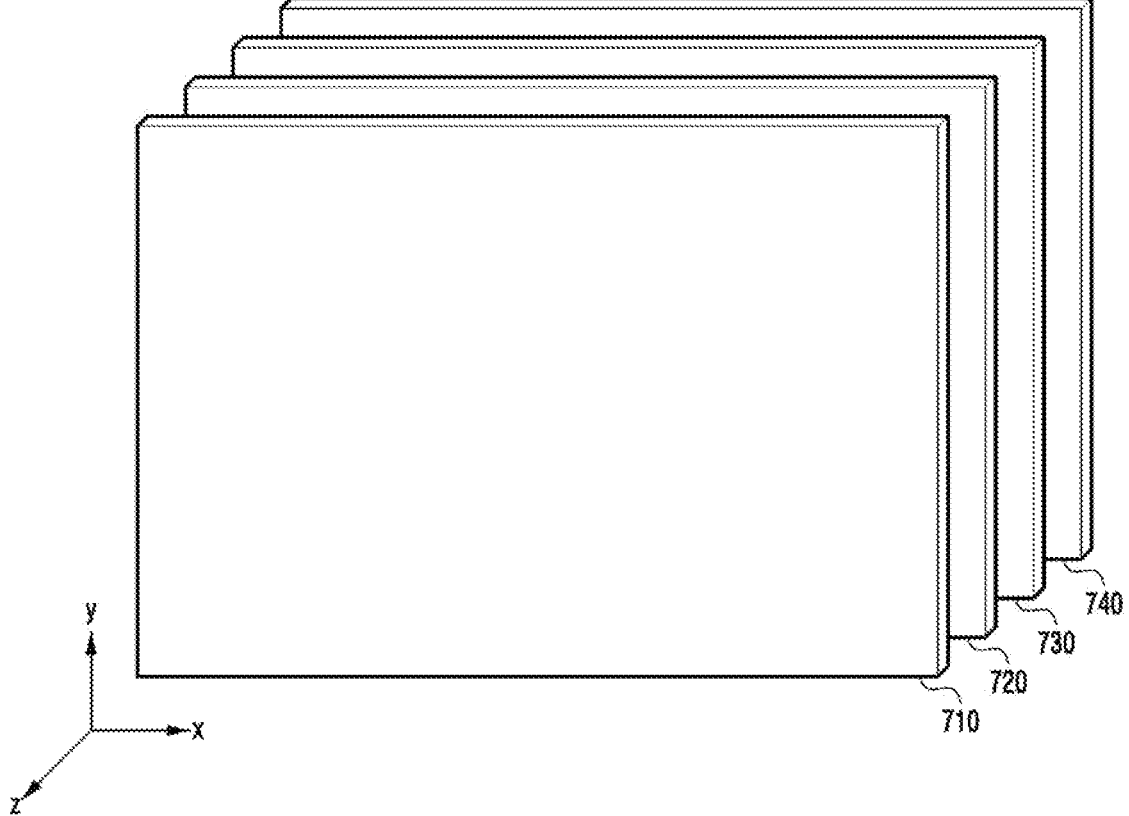
FIG. 6 illustrates a plurality of electronic devices according to one or more embodiments.

FIG. 6 illustrates a plurality of electronic devices according to one or more embodiments.

Referring to FIG. 6, a plurality of electronic devices 710, 720, 730, and 740 may be stacked in the z-axis direction. For example, the third electronic device 730 may be disposed to be spaced apart from a top surface of the fourth electronic device 740 by a predetermined distance on the z-axis. For example, the second electronic device 720 may be disposed to be spaced apart from a top surface of the third electronic device 730 by a predetermined distance on the z-axis. For example, the first electronic device 710 may be disposed to be spaced apart from a top surface of the second electronic device 720 by a predetermined distance on the z-axis.

Each of the plurality of electronic devices 710, 720, 730, and 740 may be the same as or similar to an electronic device 10.

Figure 7:
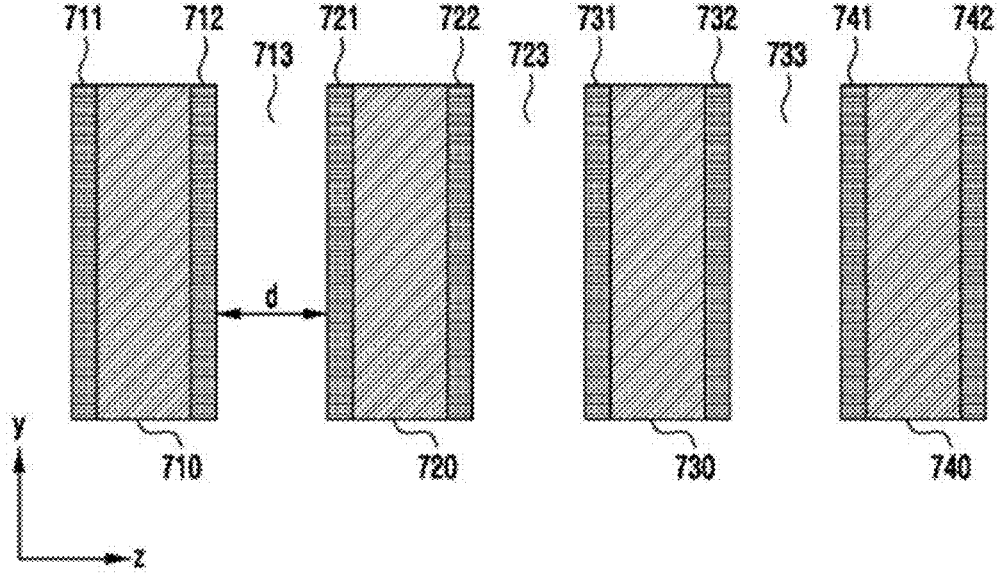
FIG. 7 illustrates a cross-sectional view based on a z-axis with respect to a plurality of electronic devices according to one or more embodiments.

FIG. 7 illustrates a cross-sectional view based on a z-axis with respect to a plurality of electronic devices according to one or more embodiments.

Referring to FIG. 7, a plurality of electronic devices 710, 720, 730, and 740 may be stacked in the z-axis direction. For example, each of the plurality of electronic devices 710, 720, 730, and 740 may be disposed to be spaced apart from each other by a predetermined distance d (713, 723, 733) on the z-axis. For example, the predetermined distance d may be 24, but is not limited thereto.

Each of the plurality of electronic devices 710, 720, 730, and 740 may be the same as or similar to an electronic device 10. For example, a top surface 711 of the first electronic device 710 may be the same as or similar to a top surface of the electronic device 10. A bottom surface 712 of the first electronic device 710 may be the same as or similar to a bottom surface of the electronic device 10.

For example, a top surface 721 of the second electronic device 720 may be the same as or similar to the top surface of the electronic device 10. A bottom surface 722 of the second electronic device 720 may be the same as or similar to the bottom surface of the electronic device 10.

For example, a top surface 731 of the third electronic device 730 may be the same as or similar to the top surface of the electronic device 10. A bottom surface 732 of the third electronic device 730 may be the same as or similar to the bottom surface of the electronic device 10.

For example, the top surface 741 of the fourth electronic device 740 may be the same as or similar to the top surface of the electronic device 10. A bottom surface 742 of the first electronic device 740 may be the same as or similar to the bottom surface of the electronic device 10.

Figure 8:
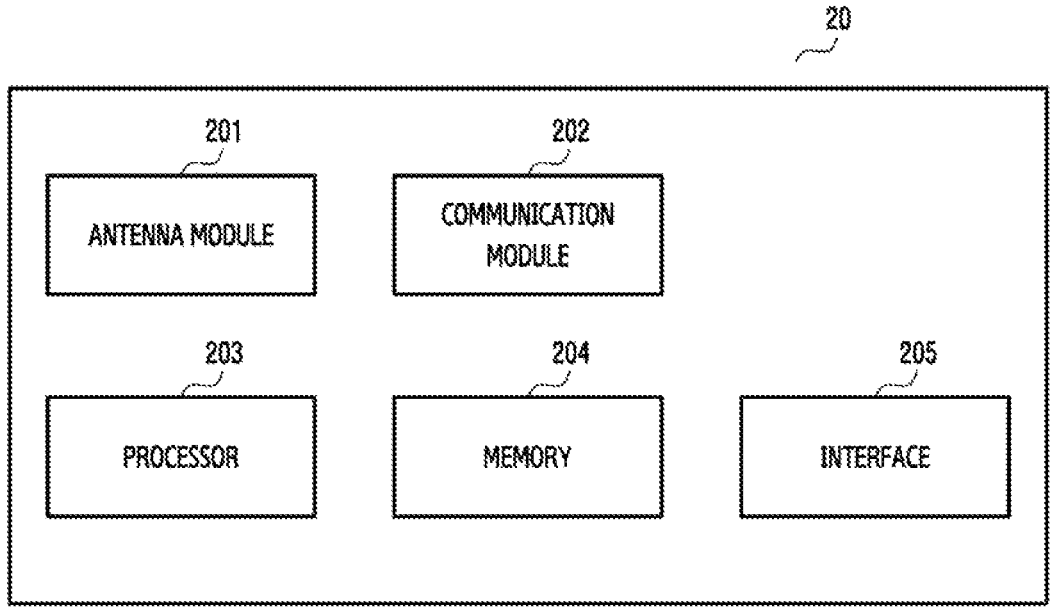
FIG. 8 is a block diagram of a controller according to one or more embodiments.

FIG. 8 is a block diagram of a controller 20 according to one or more embodiments.

Referring to FIG. 8, the controller 20 may include an antenna module 201, a communication module 202, at least one processor 203, a memory 204, and an interface 205. In some embodiments, at least one of these components may be omitted or one or more other components may be added to the controller 20. In some embodiments, some of these components may be integrated into one component.

For example, the at least one processor 203 may control at least one other component (e.g., a hardware or software component) of the controller 20 connected to the processor 203 and may perform various data processing or computation. According to an embodiment, as at least portion of data processing or computation, the processor 203 may store a command or data received from another component (e.g., the communication module 202) in the memory 204, may process the command or data stored in the memory 204, and may store the result data in the memory 204. The at least one processor 203 may include or correspond to circuitry like a central processing unit (CPU), a microprocessor unit (MPU), an application processor (AP), a coprocessor (CP), a system-on-chip (SoC), or an integrated circuit (IC).

The memory 204 may store various data used by at least one component of controller 20. The data may include, for example, input data or output data for software and commands related thereto.

The interface 205 may support one or more designated protocols that may be used to connect the controller 20 directly or wirelessly with another electronic device. According to an embodiment, the interface 205 may include, for example, a universal serial bus (USB) interface and an SD card interface.

The communication module 202 may support establishing a wired communication channel or a wireless communication channel between the controller 20 and another electronic device or server, and performing communication through the established communication channel. The communication module 202 may include one or more communication processors that operate independently of the processor 203 and support wired communication or wireless communication. According to an embodiment, the communication module 202 may communicate with the other electronic device or server through a telecommunications network such as a legacy cellular network, a 5G network, a next-generation communication network, the Internet, or a computer network (e.g., LAN or WAN). These various types of communication modules may be integrated into one component (e.g., a single chip) or may be implemented as a plurality of separate components (e.g., multiple chips).

The antenna module 201 may transmit or receive a signal or power to or from the outside (e.g., the other electronic device). According to an embodiment, the antenna module 201 may include an antenna including a conductor or a radiator made of a conductive pattern formed on a substrate (e.g., PCB). According to an embodiment, the antenna module 201 may include a plurality of antennas (e.g., an array antenna). In this case, at least one antenna suitable for the communication method used in the network may be selected from the plurality of antennas, for example, by the communication module 202. The signal or power may be transmitted or received between the communication module 202 and external electronic device through the selected at least one antenna. According to some embodiments, in addition to the radiator, another component (e.g., radio frequency integrated circuit (RFIC)) may be additionally formed as portion of the antenna module 201.

According to one or more embodiments, the antenna module 201 may form an mmWave antenna module. According to an embodiment, the mmWave antenna module may include a printed circuit board, an RFIC disposed on or adjacent to a first surface (e.g., bottom surface) of the printed circuit board and capable of supporting a designated high frequency band (e.g., mmWave band), and the plurality of antennas (e.g., the array antennas) disposed on or adjacent to a second surface (e.g., top surface or side surface) of the printed circuit board and capable of transmitting or receiving signals in the designated high frequency band.

At least some of the components may be connected to each other through a communication method (e.g., bus, general purpose input and output (GPIO), serial peripheral interface (SPI), or mobile industry processor interface (MIPI)) between peripheral devices and may exchange the signal (e.g., the command or data) with each other.

According to an embodiment, the command or data may be transmitted or received between the controller 20 and external electronic device through the server connected to a network. The external electronic device may be the same or different types of devices as the controller 20. According to an embodiment, all or portion of the operations executed in the controller 20 may be executed in the external electronic device. For example, in case that the controller 20 needs to perform some function or service automatically or in response to a request from a user or other device, instead of or additionally executing the function or service itself, the controller 20 may request one or more other external electronic devices to perform at least a portion of the function or service. The one or more external electronic devices that have received the request may execute at least a portion of the requested function or service, or an additional function or service related to the request, and may transmit a result of the execution to the controller 20. The controller 20 may process the result as it is or additionally and provide it as at least portion of the response to the request. For this purpose, for example, cloud computing, distributed computing, mobile edge computing (MEC), or client-server computing technology may be used. The controller 20 may provide an ultra-low latency service by using, for example, the distributed computing or the mobile edge computing. In another embodiment, the external electronic device may include an Internet of things (IOT) device.

For example, the interface 205 may be electrically connected to the electronic device 10. For example, the interface 205 may be electrically connected to a plurality of first ports 511, 521, 531, 541, 514, 524, 534, and 544 and a plurality of second ports 611, 612, 613, 614, 641, 642, 643, and 644.

The processor 203 may control a control signal to be transmitted to the electronic device 10 through the interface 205. For example, the processor 203 may control the control signal to be transmitted to the electronic device 10 through the interface 205 based on various instructions stored in the memory 204. The antenna module 201 may receive the beam 1 that enters a surface of the electronic device 10 and radiates to another surface.

The processor 203 may generate the control signal based on the beam 1 received through the antenna module 201 and pre-stored impedance information. For example, the memory 204 may store impedance information. For example, the impedance information may include information related to the impedance of each of a plurality of unit cells 11, 12, 13, 14, 21, 22, 23, 24, 31, 32, 33, 34, 41, 42, 43, and 44 of the electronic device 10.

For example, the operation sequence of the controller 20 may be as illustrated in FIG. 9.

FIG. 9 is a flowchart illustrating an operation sequence of a controller 20 according to one or more embodiments.

Referring to FIG. 9, the controller 20 may receive a beam radiated from an electronic device 10 through an antenna module 201 (S901). For example, the controller 20 may receive the beam 1 radiated from another surface of the electronic device 10 through the antenna module 201.

The controller 20 may determine the electric field distribution value of the electronic device 10 based on the beam 1 radiated from the electronic device 10 (S902). For example, the processor 201 may determine the electric field distribution value of the electronic device 10 based on the beam 1 radiated from the electronic device 10. For example, the phase distribution value of the electric field (E-field) of the electronic device 10 may be expressed as $\psi(x, y)$.

Here, the x may be a column number based on an arbitrary point on the plane of the electronic device 10. The y may be a row number based on an arbitrary point on the plane of the electronic device 10. For example, the x may mean the column number based on the 1-1 electronic device 11. The y may mean the row number based on the 1-1 electronic device 11.

The controller 20 may determine the impedance distribution value of the electronic device 10 based on the electric field distribution value of the electronic device 10 (S903). For example, the processor 201 may determine the impedance distribution value of the electronic device 10 based on the electric field distribution value of the electronic device 10.

For example, the impedance distribution value may be expressed as C(x, y). Here, the x may be the column number based on the arbitrary point on the plane of the electronic device 10. The y may be the row number based on the arbitrary point on the plane of the electronic device 10. For example, the x may mean the column number based on the 1-1 electronic device 11. The y may mean the row number based on the 1-1 electronic device 11.

The controller 20 may determine the location of a transmitter 30 an artificial intelligence model (such as a deep learning model) based on the impedance distribution value of the electronic device 10 (S904).

The controller 20 may determine the radiation pattern of the beam 1 based on the location of the transmitter 30 (S905). For example, the radiation pattern value of beam 1 may be expressed as G ($\Phi$, $\theta$). For example, the direction of the beam 1 may be expressed as a $\theta$ value based on the z-axis and a $\Phi$ value based on the y-axis.

The controller 20 may generate a control signal based on the determined radiation pattern (S906). For example, the processor 201 may generate the control signal based on the determined radiation pattern. For example, the control signal may be a signal for controlling the direction of the beam 1 radiated from the other surface of the electronic device 10.

The controller 20 may transmit the control signal to the electronic device 10 (S907). For example, the processor 203 may control the control signal to be transmitted to at least one of a plurality of first ports 511, 521, 531, 541, 514, 524, 534, and 544 and a plurality of second ports 611, 612, 613, 614, 641, 642, 643, and 644 through the interface 205.

The electronic device 10 may receive the control signal from the controller 20. The electronic device 10 may control the direction of the beam 1 based on the control signal.

An electronic device according to various embodiments disclosed in the present document may be various types of devices. The electronic device according to an embodiment of the present document is not limited to the above-described devices.

The various embodiments of the present document and terms used herein are not intended to limit the technical features described in the present document to specific embodiments, and should be understood to include various modifications, equivalents, or substitutes of the embodiment. In relation to the description of the drawings, a similar reference numeral may be used for a similar or related component. The singular form of the noun corresponding to the item may include one or a plurality of items unless explicitly indicated differently in the context involved. In the present document, each of the phrases such as "A or B", "at least one of A and B", "at least one of A or B", "A, B or C", "at least one of A, B and C", and "at least one of A, B or C" may include any one among the items listed together with the corresponding phrase among the phrases, or all possible combinations thereof. Terms such as "1st", "2nd", or "first", or "second" may be used simply to distinguish a corresponding component from another corresponding component, and do not limit the corresponding component to other aspects (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "module" used in various embodiments of the present document may include units implemented in hardware, software, or firmware, and may be used interchangeably with terms such as logic, logic block, component, or circuit, for example. The module may be an integrally configured component or a minimum unit of the component or a part thereof that performs one or more functions. For example, according to an embodiment, the module may be implemented in the form of an application-specific integrated circuit (ASIC).

Various embodiments of the present document may be implemented as a software including one or more instructions stored in a storage medium (e.g., a memory 204) that may be read by a machine (e.g., a controller 20). For example, a processor (e.g., a processor 203) of the machine (e.g., the controller 20) may call at least one instruction among one or more instructions stored from the storage medium and execute it. This makes it possible for the machine to be operated to perform at least one function according to the at least one instruction called. The one or more instructions may include code generated by a compiler or code that may be executed by an interpreter. The machine-readable storage medium may be provided in the form of a non-transitory storage medium. Here, 'non-transitory' only means that the storage medium is a tangible device and does not include a signal (e.g., electromagnetic waves), and this term does not distinguish between a case where data is semi-permanently stored in the storage medium and a case where data is temporarily stored.

According to an embodiment, a method according to various embodiments disclosed in the present document may be included in a computer program product and provided. The computer program product may be traded between a seller and a buyer as a product. The computer program product may be distributed in the form of machine-readable storage medium (e.g., compact disc read only memory (CD-ROM)), or may be distributed (e.g., downloaded or uploaded) online, through an application store (e.g., Play Store™) or directly between two user devices (e.g., smartphones). In case of the online distribution, at least a portion of the computer program product may be at least temporarily stored or temporarily generated in the machine-readable storage medium, such as the memory of a manufacturer's server, an application store's server, or a relay server.

According to various embodiments, each component (e.g., module or program) of the above-described components may include a single or plural entity, and some of the plurality of entities may be separately disposed in other components. According to various embodiments, one or more components among the above-described corresponding components or operations may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration. According to various embodiments, operations performed by the module, the program, or another component may be carried out sequentially, in parallel, repeatedly, or heuristically, or one or more of the operations may be executed in a different order or omitted, or one or more other operations may be added.

Functions related to artificial intelligence according to the disclosure are operated by a processor and a memory. The processor may include one or more processors. Here, the one or more processors may include a general-purpose processor, such as a central processing unit (CPU), an application processor, or a digital signal processor (DSP), a graphics-dedicated processor, such as a graphics processing unit (GPU) or a vision processing unit (VPU), or an artificial intelligence-dedicated processor, such as a neural processing unit (NPU). The one or more processors control input data to be processed according to predefined operation rules or artificial intelligence models, which are stored in the memory. Alternatively, when the one or more processors are artificial intelligence-dedicated processors, the artificial intelligence-dedicated processors may be designed in a hardware structure specialized for processing of a particular artificial intelligence model.

The predefined operation rules or the artificial intelligence models are made through training. Here, the statement of being made through training means that a basic artificial intelligence model is trained by a learning algorithm by using a large number of training data, thereby making a predefined operation rule or an artificial intelligence model, which is configured to perform a desired characteristic (or purpose). Such training may be performed in a device itself, in which artificial intelligence according to the disclosure is performed, or may be performed via a separate server and/or a separate system. Examples of the learning algorithm may include, but are not limited to, supervised learning, unsupervised learning, semi-supervised learning, and reinforcement learning.

The artificial intelligence model may include a plurality of neural network layers. Each of the plurality of neural network layers has a plurality of weight values and performs neural network calculations through calculations between a calculation result of a previous layer and the plurality of weight values. The plurality of weight values of the plurality of neural network layers may be optimized by a training result of the artificial intelligence model. For example, the plurality of weight values may be updated to minimize a loss value or a cost value, which is obtained from the artificial intelligence model during the process of training. An artificial neural network may include a deep neural network (DNN), and examples of the artificial neural network may include, but are not limited to, a convolutional neural network (CNN), a DNN, a recurrent neural network (RNN), a restricted Boltzmann machine (RBM), a deep belief network (DBN), a bidirectional recurrent deep neural network (BRDNN), and deep Q-Networks.

In the above-described specific embodiments of the disclosure, components included in the disclosure are expressed in singular or plural according to the specific embodiments presented. However, the singular or plural expressions are selected appropriately for the situation presented for the convenience of explanation, and the disclosure is not limited to singular or plural components, and even a component expressed in plural may be configured with a singular number, or even a component expressed in singular may be configured with a plural number.

Although specific embodiments have been described in the detailed description of the present disclosure, it is to be understood that various modifications are possible with not departing from the scope of the present disclosure. Therefore, the scope of the present disclosure should not be limited to the embodiments described, but should be determined not only by the scope of the patent claims described later, but also by the scope equivalent to the scope of the patent claims.

What is claimed is:

1. An electronic device comprising:
a glass substrate comprising a first surface and a second surface opposite to the first surface;
a semiconductor element provided on the first surface of the glass substrate;
a first pattern provided on the first surface of the glass substrate, the first pattern being electrically connected to a first end of the semiconductor element;
a second pattern provided on the first surface of the glass substrate, the second pattern being electrically connected to a second end of the semiconductor element;
a feeding line provided on the second surface of the glass substrate; and
a via hole which passes through the glass substrate in a first direction, the via hole electrically connecting the feeding line to the second pattern.

2. The electronic device of claim 1, wherein the first pattern has a T shape.

3. The electronic device of claim 1, wherein the first pattern comprises:
a first sub-pattern extending in a second direction; and
a second sub-pattern extending in a third direction.

4. The electronic device of claim 3, wherein a first end of the first sub-pattern is electrically connected to the first end of the semiconductor element, and
wherein a second end of the first sub-pattern is connected to a central portion of the second sub-pattern.

5. The electronic device of claim 4, further comprising a first port electrically connected to the first pattern.

6. The electronic device of claim 5, wherein an end of the first port is electrically connected to an end of the second sub-pattern.

7. The electronic device of claim 1, wherein the second pattern has a T shape.

8. The electronic device of claim 7, wherein the second pattern comprises:
a first sub-pattern extending in a second direction; and
a second sub-pattern extending in a third direction.

9. The electronic device of claim 8, wherein a first end of the first sub-pattern is electrically connected to the second end of the semiconductor element, and
wherein a second end of the first sub-pattern is connected to a central portion of the second sub-pattern.

10. The electronic device of claim 9, wherein the central portion of the second sub-pattern is electrically connected to an end of the via hole.

11. The electronic device of claim 10, further comprising a second port electrically connected to the second pattern, the via hole, and the feeding line.

12. The electronic device of claim 11, wherein an end of the second port is electrically connected to the second sub-pattern.

13. The electronic device of claim 11, wherein an end of the second port is electrically connected to the via hole.

14. The electronic device of claim 11, wherein an end of the second port is electrically connected to the feeding line.

15. An electronic device comprising:
a plurality of unit cells, each of the unit cells comprising:
a glass substrate comprising a first surface and a second surface opposite to the first surface,
a semiconductor element provided on the first surface of the glass substrate,
a first pattern provided on the first surface of the glass substrate, the first pattern being electrically connected to a first end of the semiconductor element,
a second pattern provided on the first surface of the glass substrate, the second pattern being electrically connected to a second end of the semiconductor element,
a feeding line provided on the second surface of the glass substrate, and
a via hole which passes through the glass substrate in a first direction, the via hole electrically connecting the feeding line to the second pattern; and
a controller that configured to supplies electric signals for the plurality of unit cells.

16. The electronic device of claim 15, wherein the first pattern comprises:
a first sub-pattern extending in a second direction perpendicular to the first direction, and
a second sub-pattern extending in a third direction perpendicular to the first direction and the second direction.

17. The electronic device of claim 16,
wherein a first end of the first sub-pattern is electrically connected to the first end of the semiconductor element, and
wherein a second end of the first sub-pattern is connected to a central portion of the second sub-pattern.

18. The electronic device of claim 17, further comprising a first port electrically connected to the first pattern.

19. The electronic device of claim 18, wherein an end of the first port is electrically connected to an end of the second sub-pattern.

20. The electronic device of claim 15, wherein the second pattern comprises:
a first sub-pattern extending in a second direction perpendicular to the first direction, and
a second sub-pattern extending in a third direction perpendicular to the first direction and the second direction.

* * * * *